US006927405B1

(12) United States Patent
Bonnet et al.

(10) Patent No.: US 6,927,405 B1
(45) Date of Patent: *Aug. 9, 2005

(54) METHOD FOR OBTAINING AN EXTREME ULTRAVIOLET RADIATION SOURCE, RADIATION SOURCE AND USE IN LITHOGRAPHY

(75) Inventors: Laurence Bonnet, Linas (FR); Danièle Babonneau, Morsang/Orge (FR); Rémy Marmoret, Levis St Nom (FR)

(73) Assignee: Commissariat a l'Energie Atomique, Paris (FR)

( * ) Notice: Subject to any disclaimer, the term of this patent is extended or adjusted under 35 U.S.C. 154(b) by 504 days.

This patent is subject to a terminal disclaimer.

(21) Appl. No.: 10/130,125

(22) PCT Filed: Nov. 14, 2000

(86) PCT No.: PCT/FR00/03163

§ 371 (c)(1),
(2), (4) Date: May 14, 2002

(87) PCT Pub. No.: WO01/37618

PCT Pub. Date: May 25, 2001

(30) Foreign Application Priority Data

Nov. 15, 1999 (FR) .................................. 99 14285

(51) Int. Cl.[7] .......................... G21G 4/00; G03B 27/54
(52) U.S. Cl. ........................ 250/493.1; 355/67; 355/53
(58) Field of Search ............. 378/119, 34; 250/504 R, 250/492.2, 493.1; 355/67, 53, 30, 52

(56) References Cited

U.S. PATENT DOCUMENTS 4,504,964 A    3/1985  Cartz et al.
4,630,274 A   12/1986  Schafer
5,293,396 A    3/1994  Tomie
5,433,988 A *  7/1995  Fukuda et al. .............. 428/141
6,339,634 B1 * 1/2002  Kandaka et al. ............ 378/119
6,724,465 B2 * 4/2004  Babonneau et al. .......... 355/67

FOREIGN PATENT DOCUMENTS

EP    0 143 446 A2   6/1985
EP    0 181 194 A2   5/1986
EP    0 474 011 A2   3/1992

OTHER PUBLICATIONS

K. Eidmann and T. Kishimoto, "Absolutely measured x-ray spectra from laser plasmas with targets of different elements", Aug., 1986, pp. 377-378, Applied Physics Letters.
Steven J. Haney, Kurt W. Berger, Glenn D. Kubiak, Paul D. Rockett and John Hunter, "Prototype high-speed tape target transport for a laser plasma soft-x-ray projection lithography source", Dec., 1993, pp. 6934-6937, Applied Optics, vol. 32, No. 34.
H. Hirose, K. Ando. and Y. Aoyagi, "Novel x-ray source using rear side x-ray emission from the foil target", 1996, pp. 277-280, Prog. Crystal Growth and Charact. vol. 33.

* cited by examiner

Primary Examiner—John R. Lee
Assistant Examiner—Johnnie L Smith, II
(74) Attorney, Agent, or Firm—Pearne & Gordon LLP

(57) ABSTRACT

Method for obtaining extreme ultraviolet radiation and a source thereof, application in lithography.

According to the invention, at least a solid target (28) is used, emitting extreme ultraviolet radiation by interaction with a laser beam focussed on a face (30) of the target. This target is able to emit a portion of the radiation from the opposite face (37) and this portion is collected and transmitted.

11 Claims, 3 Drawing Sheets

METHOD FOR OBTAINING AN EXTREME ULTRAVIOLET RADIATION SOURCE, RADIATION SOURCE AND USE IN LITHOGRAPHY

TECHNICAL FIELD

The present invention relates to a method for obtaining extreme ultraviolet radiation which is also called "EUV radiation" and to a source thereof.

This is radiation with a wavelength included in the range from 8 nanometers to 25 nanometers.

The present invention has many applications, especially in material science, in microscopy and most particularly in lithography.

The present invention also relates to a lithography device which uses the source of EUV radiation, object of the invention.

By using such radiation, the etching pitch of integrated circuits may be reduced and integrated circuits with a very high integration level may be manufactured.

PRIOR STATE OF THE ART

Let us recall that a lithography device is for insolating a sample according to a determined design (<<pattern>>). This sample generally comprises a semiconductor substrate on which is coated a layer of photosensitive resin (<<photoresist layer>>) which is provided to be insolated according to the determined pattern.

A lithography device comprises:
- a source of insolation radiation,
- a mask on which the pattern to be insolated is reproduced with a magnification factor at least equal to four,
- a sample support, and
- optical means which let the radiation be transferred between the source and the mask on the one hand and between the mask and the sample on the other hand.

Two techniques for producing an intense EUV radiation are mainly known. Both of them are based on collecting the photons, produced through a microscopic process of spontaneous emission, by a hot and not very dense plasma which is generated by means of a laser.

The first technique uses a xenon jet irradiated by a YAG laser with a power close to 1 kW. Indeed, when the nature of the gas and the expansion conditions in vacuo (<<vacuum>>) are well selected, aggregates (<<clusters>>) are naturally generated in the jet, by a multibody interaction. These are macroparticles which may contain up to one million atoms and exhibit a sufficiently high density (about a tenth of the solid's density) in order to absorb the laser beam and thus to heat the atoms from the surrounding gas which may then emit photons by fluorescence.

The EUV radiation or soft X radiation thereby obtained is collected by suitable optical means, is spatially shaped through several intermediate optical means and then it irradiates the mask. The intermediate optical means used are multilayer mirrors which exhibit a high but narrow reflectivity peak (with a transmission bandwidth from 2 to 5% depending on the considered multilayers) in the neighborhood of the investigated EUV wavelength (for example, 13.4 nm with alternating Mo and Si layers and 11.2 nm with alternating Mo and Be layers).

The second technique uses the corona of a plasma with a high atomic number, obtained by interaction of a laser beam, which is issued from a KrF laser and has an intensity close to $10^{12}$ W/cm$^2$, and from a solid target of a large thickness (at least 20 $\mu$m).

This is schematically illustrated in FIG. 1 where this solid target 2 is to be seen, wherein the laser beam 6 is focussed on a face 4 thereof, via suitable focussing optical means 8. In FIG. 1, the EUV radiation 10 generated by the interaction of the focussed laser beam with the target material is also seen. This radiation is emitted from face 4 called the <<front face>> and is recovered by appropriate optical collecting means 12.

In the illustrated example, these optical collecting means 12 are positioned facing the front face 4, they include an aperture 14 to let the focussed laser beam pass through and collect the EUV radiation 10 in order to send it towards other optical means (not illustrated) in order to use this EUV radiation. The most suitable material for this kind of source seems to be rhenium for an emission close to 13.4 nm. The conversion ratio obtained with this material (ratio between the emitted radiative energy and the incident energy) may even reach 0.85% in a 2% transmission bandwidth around this wavelength of 13.4 nm.

The energy of such a EUV radiation source is however insufficient as the laser energy, in the case of the quoted experiments, is only of the order of 1 J to a few joules.

But above all, the photon collecting efficiency is low (of the order of 10%) and this finally results in that the yield (usable photons/laser energy) is too low. Furthermore, the target's expansion is significant so that specific devices must be designed in order to keep the emitted particles away from the collecting optical means during the interaction of the laser beam with the target.

The aforementioned difficulties result from the nature of the physical process used, i.e. emission by fluorescence from a hot and not very dense medium. Indeed, when a bound electron is excited within an atom or a multicharged ion, by a process involving either a photon (radiative mechanism) or an electron (collision mechanism), this atom or this ion is again found to be in an excited state which is not stable. It then may decay by emitting one or several photons.

In order to obtain a photon with a precise wavelength (to within the transition width), it is therefore sufficient to generate a suitable multicharged ion wherein energy transitions matching the energy of the required photon exist. It should be noted that when the photon is emitted through spontaneous emission, it does not have any favored direction and an isotropic emission is obtained.

One of the best techniques suitable for generating a large number of excited multicharged ions, uses the interaction of a power laser beam with a high density medium. Actually, when a power laser beam interacts with a solid (or quasi-solid) target, the electromagnetic wave associated with the laser beam is propagated in the medium up to a so-called cut-off density (which is inversely proportional to $\lambda^2$ where $\lambda$ is the laser's wavelength) and it transfers its energy to this medium via several microscopic processes.

Bound electrons are then likely to be extracted from the atoms, to be accelerated by the electric field generated by the laser and to gain sufficient kinetic energy so as to extract in turn other bound electrons. Multicharged ions are thereby generated, the temperature of the medium rapidly increases until it reaches extreme values (several hundreds of thousands, even several millions of degrees) and microscopic processes leading to emission of photons may occur. In fact under the action of the laser field, the medium is changed into a plasma formed by multicharged ions, electrons and photons.

Except for particular density, temperature and/or radiation field conditions, the various aforementioned species are not in equilibrium with one another. This is notably observed in the corona of a plasma which corresponds to the expansion area where the laser's electromagnetic wave is propagated and strongly interacts with the medium. This corona is characterized by low matter density (less than 0.001 times the solid's density) and by a high temperature. The likelihood that an emitted photon in the corona is reabsorbed therein, is extremely low. This corona is said to be optically thin.

The emitted photons leave the plasma and may then be used for different purposes, for example for diagnosing thermodynamic conditions of the medium by spectroscopy or for a lithography.

Let us re-examine the drawbacks of known EUV radiation sources.

These sources pose a problem of efficiency: highly varied thermodynamic conditions (density, temperature, number of free electrons) are encountered in the corona of a plasma generated by a laser, both over time and space.

The characteristic emission spectrum of radiation from a corona close to 10 nm is very complex and consists of a large number of emission lines produced by atomic emission or from different states of charge. When a well determined line is selected with a very narrow bandwidth (of the order of 2%), it is seen that a large part of the energy emitted by the plasma as radiation is outside this bandwidth and is therefore lost.

Accordingly, efficiency (produced and used EUV energy/ used laser energy) is strongly reduced. Further, <<parasitic>> radiation is emitted isotropically, in particular, in the solid angle for collecting useful photons and therefore towards the optical means for collecting theses photons.

As for collecting EUV radiation, because photon emission by a hot jet is isotropic, suitable optical collecting means should be provided. Generally, an umbrella-shaped optical collector, obtained by juxtaposition of elementary optical collectors (generally six of them). In order that its solid angle is maximum, this collector should exhibit a large surface area and should be placed as close as possible to the plasma which emits the EUV radiation.

This is materially very difficult (especially in the case of use of xenon aggregates because of the presence of a nozzle and of a xenon recovering system) and this also causes problems in terms of the collector's lifetime and of the achievement of the latter. This collector should therefore be positioned away from the EUV radiation source, however the collection angle will then be reduced (unless a giant collector is built for which the costs would be prohibitive). This therefore results in a loss of efficiency.

The same problems are posed in the case of the use of a solid target where the EUV radiation is emitted by the front face of this target. Moreover, in this case, the plasma corona generated by the laser has a very large expansion velocity (greater than $10^5$ cm/s), even for moderate laser illumination. Accordingly, the particles of matter are likely to contaminate and damage the different optics used, with consequently a risk of reducing the reflection properties of these optics and thus the number of photons which reach the photosensitive resin layer to be insolated. Specific devices need to be designed for removing these particles or remnants.

Further, as emission by fluorescence from a hot and not very dense plasma does not have a favored direction, specific optical means should be inserted between the collector and the mask in order to spatially shape the radiation field. These specific optical means comprise multilayer mirrors and therefore lead to a loss of photons. They are also a further cause of cost and difficulties in optical alignment.

A EUV radiation source using a thick solid target, which emits the EUV radiation through the front face, the face receiving the focused laser beam, thus suffers from different drawbacks, i.e. emission of remnants and isotropic emission of EUV radiation which therefore has a large angular divergence. As a result, in particular, a lithography device using such a source is not very efficient.

DESCRIPTION OF THE INVENTION

The object of the present invention is to overcome the above drawbacks by providing a EUV radiation source which is anisotropic. This EUV radiation (for example to be used in a lithography device) is emitted by the back face of a solid target of suitable thickness on the front face of which is focused the laser beam.

Such an anisotropic source provides an increase in the useful portion of the EUV radiation beam and a simplification of the optical means for collecting this radiation.

Specifically, the object of the present invention is a method for obtaining extreme ultraviolet radiation, a method according to which at least a solid target is used, with first and second faces, wherein this target is able to emit extreme ultraviolet radiation by interaction with a laser beam, and the laser beam is focussed on the first face of the target, a method characterized in that the target contains material which is able to emit the extreme ultraviolet radiation by interacting with the laser beam, and in that the thickness of the target is in a range from about 0.05 $\mu$m to about 5 $\mu$m, wherein the target is able to emit a portion of the extreme ultraviolet radiation from the second face of this target, anisotropically, and in that this portion of extreme ultraviolet radiation is collected and transmitted for this portion to be used.

The object of the invention is also an extreme ultraviolet radiation source, wherein this source comprises at least a solid target, with first and second faces, wherein this target is able to emit extreme ultraviolet radiation by interacting with a laser beam focussed on the first face of the target, this source is characterized in that the target contains material which is able to emit the extreme ultraviolet radiation by interacting with the laser beam, and in that the thickness of the target is included in a range from about 0.05 $\mu$m to about 5 $\mu$m, wherein the target is able to anisotropically emit a portion of the extreme ultraviolet radiation from the second face of this target, wherein this extreme ultraviolet radiation portion is collected and transmitted for this portion to be used.

Preferably, the atomic number of the material contained in the target belongs to the set of atomic numbers from 28 to 92.

According to a particular embodiment of the source which is the object of the invention, this source comprises a plurality of targets which are firmly secured to one another, the source further comprising means for moving this plurality of targets so that these targets receive the laser beam in succession.

The source may further comprise support means to which the targets are fixed and which are able to let the laser beam pass through in the direction of these targets, wherein the moving means are provided for moving these support means and thereby the targets.

These support means may be able to absorb radiations emitted by the first face of each target receiving the laser beam and to re-emit these radiations towards this target.

According to a first particular embodiment of the source, object of the invention, these support means comprise an aperture facing each target, wherein this aperture is delimited by two walls substantially parallel to one another and perpendicular to this target.

According to a second particular embodiment, these support means comprise an aperture facing each target, wherein this aperture is delimited by two walls which run towards the target and away from one another.

According to a particular embodiment of the invention, the source further comprises fixed auxiliary means which are able to let the laser beam pass through in the direction of the target, to absorb radiations emitted by the first face of this target and to re-emit these radiations towards this target.

The object of the present invention is also a lithography device comprising:
  a support for a sample which is to be insolated according to a determined pattern,
  an extreme ultraviolet source in accordance with the invention,
  a mask comprising the determined pattern in an enlarged form,
  optical means for collecting and transmitting, to the mask, the portion of extreme ultraviolet radiation from the second face of the target of the source, wherein the mask is thereby able to provide an image of the pattern in an enlarged form, and
  optical means for reducing this image and for projecting the reduced image on the sample.

The sample may comprise a semi-conductor substrate whereon is coated a layer of photosensitive resin which is to be insolated according to the determined pattern.

BRIEF DESCRIPTION OF THE DRAWINGS

The present invention will be better understood upon reading the description of exemplary embodiments given hereafter, for purely informative and non-limiting purposes, with reference to the appended drawings wherein.

DETAILED DESCRIPTION OF PARTICULAR EMBODIMENTS

Figure 1:
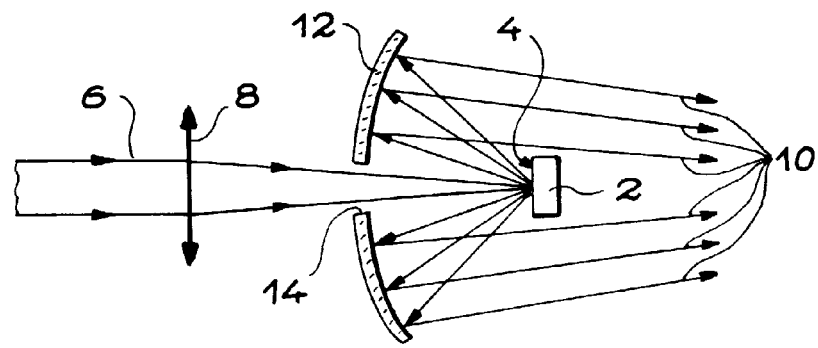
FIG. 1 is a schematic view of a known EUV radiation source and it has already been described.

A plasma generated through the interaction of a solid target and of a laser beam includes several areas. Of course there is the interaction area which is called <<the corona>> but there is also, in a successive and simplified way:
  an area called <<conduction area>> where the laser beam does not penetrate and the evolution of which is controlled by thermal, electron and radiative conductions, wherein a portion of the photons emitted by the ions of the corona, is emitted in the direction of the cold and dense portion of the target, and
  the absorption and re-emission area where the high energy photons which come from the corona or from the conduction area, are absorbed by the dense and cold matter and they thus contribute to heating this matter and thereby to the emission of lower energy photons.

The latter form a radiative wave which, in the medium, has a favored propagation direction, along the temperature gradient and which, when the target is not too thick, may exit the target through the back face of the latter, the face which is geometrically opposite to the one where the laser has interacted. The conversion efficiency at the back face (ratio between the radiative energy, including all wavelengths, to the incident laser energy) may be close to 30%.

Such emission from the back face of the target is characterized by a very different spectral distribution from the one from the front face because temperature and density conditions of the areas responsible for the emission of photons, are very different. The emitted radiation naturally has an angular distribution, even with a perfectly plane target: this radiation is not isotropic.

Further, the characteristic expansion velocity of the back face is lower, by several orders of magnitude, than that of the front face, whereby the major part of the energy is in the form of radiation.

That is why EUV radiation emitted by the back face of a solid target with a suitable thickness on the front face of which the laser beam is focussed, is used in the present invention. In this way, anisotropic EUV radiation is obtained and the matter remnants are reduced to a minimum.

For generating EUV radiation, the target preferably contains a material for which the atomic number Z is such that $28 \leq Z \leq 92$.

It is possible to mix or associate with this material, other materials which are also capable of generating, through interaction with the laser beam, EUV radiation having the right spectral characteristics.

Furthermore, it may be optionally associated with one or several other materials with low atomic numbers, for filtering out parasitic radiation.

The target's thickness, containing the material generating the EUV radiation, or active element, is preferably between 0.1 $\mu$m and 5 $\mu$m.

Preferably, the target is optimized in order to obtain effective emission by the back face, without having a too significant expansion of the matter.

The laser's characteristics are also adapted (in particular, the duration and the time shape of the provided light pulses, their wavelength and intensity) for obtaining the thermodynamic conditions required in the target for optimal EUV conversion at the back face, in the desired range of wavelengths, which ranges for example from 10 nanometers to 20 nanometers.

Figure 2:
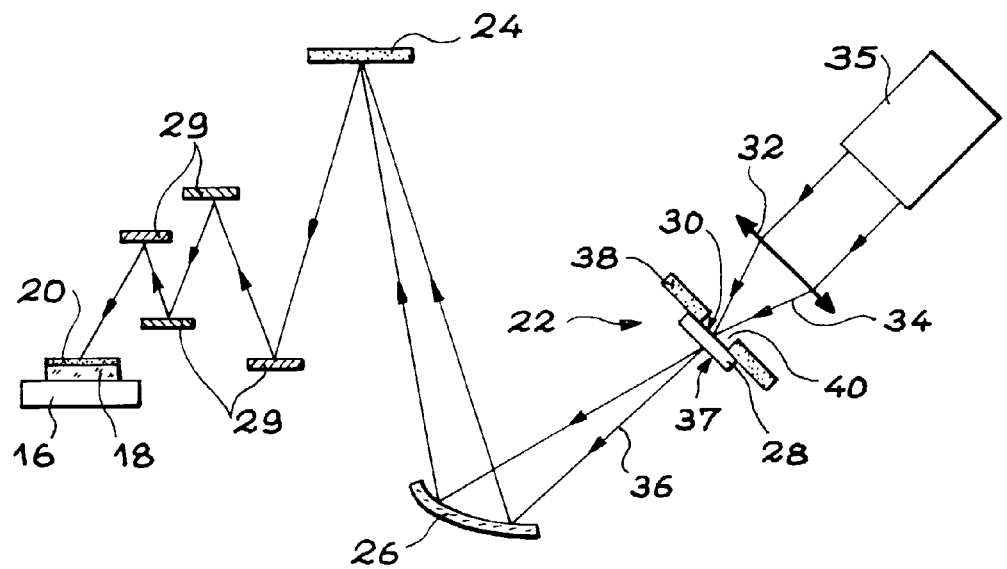
FIG. 2 is a schematic view of a particular embodiment of the lithography device, object of the invention which uses a EUV radiation source in accordance with the invention.

In FIG. 2, a particular embodiment of the EUV radiation source, object of the invention, is schematically illustrated in a special application to lithography.

Now in this FIG. 2, a lithography device is seen schematically, comprising a support 16 of a semiconductor substrate 18, for example a silicon substrate, on which is coated a layer 20 of photosensitive resin, to be insolated according to a determined pattern.

In addition to the EUV radiation source 22 in accordance with the invention, the device comprises:
  a mask 24, comprising the pattern in an enlarged form,
  optical means 26 for collecting and transmitting, to mask 24, the portion of EUV radiation provided by the back face of the solid target 28 which the source includes, wherein mask 24 provides an image of this pattern in an enlarged form, and optical means 29 for reducing this image and for projecting the reduced image onto the layer 20 of photosensitive resin.

The target is for example made out of a material such as silver, copper, samarium or rhenium and it has low thickness (for example of the order of 1 µm).

In order to generate the EUV radiation for insolating the photosensitive resin layer, a pulsed beam 34 emitted by a pulsed laser 35 is focussed on a first face 30 of the target, called <<the front face>>, via optical focusing means 32. The target 28 then emits anisotropic EUV radiation 36 from its back face 37 which is opposite to the front face 30.

It is specified that source 22, collector 26, mask 24, optical means 29 and support 16 bearing the substrate 20 are placed in en enclosure (not shown) where low pressure is applied. The laser beam is sent into this enclosure through a suitable porthole (not shown).

In the example of FIG. 2, the optical collecting means 26 consist of an optical collector which is positioned facing the back face 37 of target 28, provided for collecting the EUV radiation anisotropically emitted by this back face, for shaping this radiation and sending it to mask 24.

In the device of FIG. 2, provision of further optical means between collector 26 and mask 34 is therefore not required, thereby simplifying the optical means of the lithography device.

It is seen that the target with low thickness 28 is fixed by its front face 30 to a support 38 provided with an aperture 40 for letting the focussed laser beam 34 pass through so that it reaches this front face.

Practically, as a single laser pulse locally destroys the target with low thickness, it is not possible to send the laser beam onto the same spot of the target, twice. That is why the support 38 is provided with moving means (not shown in FIG. 2) which enable the different areas of the target to be successively exposed to the focussed laser beam.

Figure 3:
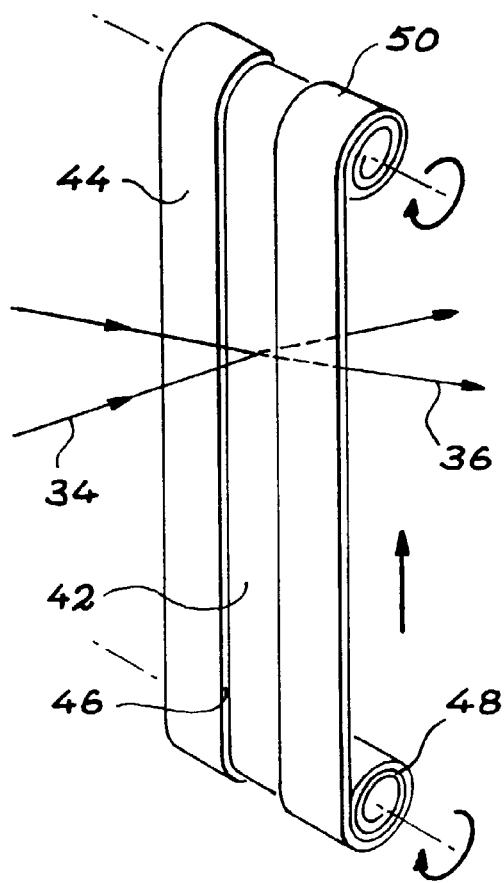
FIG. 3 is a perspective schematic view of a strip forming a set of targets which are usable in the invention.

This is schematically illustrated in FIG. 3, where a solid target 42 with low thickness (for example 1 µm) is seen as a strip, fixed to a flexible support 44 which, for example, is made in plastic and provided with a longitudinal aperture 46 in order to let the focussed beam 34 pass through.

The target-support as a whole forms a flexible composite strip which is unwound from a first spool 48 and is wound onto a second spool 50 which may be rotated by suitable means (not shown), so as to move the target facing the focussed laser beam including pulses which successively reach different areas of the target. It may then be considered that several targets are assembled together.

In an alternative embodiment (not shown), it is further possible to use a flexible strip in plastic as a target support and to fix several targets on this support, at regular intervals, wherein an aperture is then provided in the support facing each target so as to let the focussed beam pass through.

Preferably, instead of a plastic strip, a strip 52 (FIG. 4) for example in copper, silver, samarium or rhenium, is used as target support, and able to absorb radiation(s) emitted by the front face of target 42 under the impact of the focussed beam 34 and to re-emit this (these) radiation(s) in the direction of this target (which is movable with the strip 52). For example this strip 52 has a thickness of the order of 5 µm to 10 µm.

Figure 4:
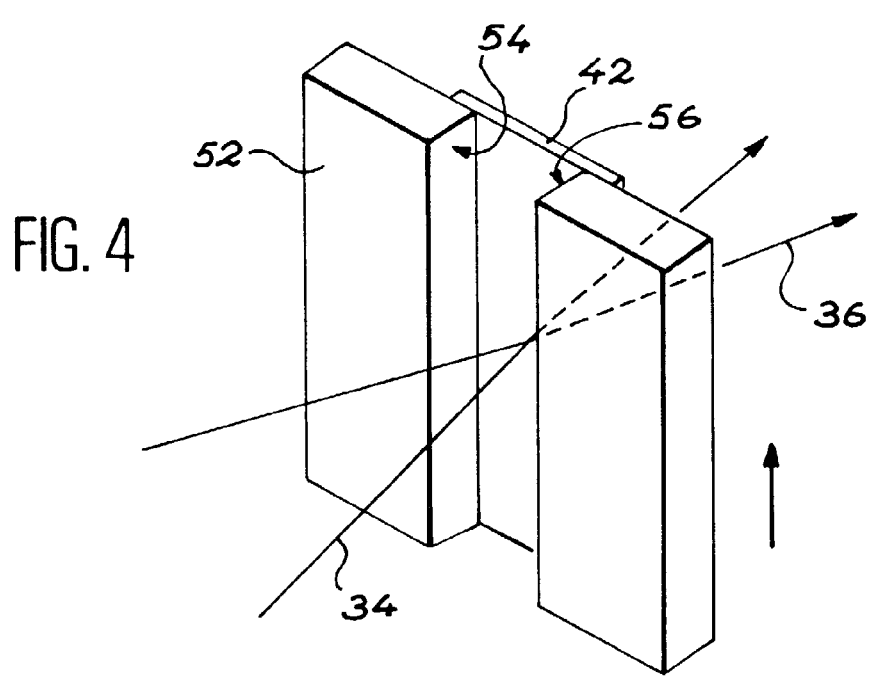
FIGS. 4 and 5 are perspective schematic and partial views of EUV radiation sources according to the invention.

The longitudinal aperture letting the laser beam 34 pass through, which is focussed on the target, may be delimited by two walls 54 and 56 substantially parallel to one another and substantially perpendicular to the target as is seen in FIG. 4.

Figure 5:
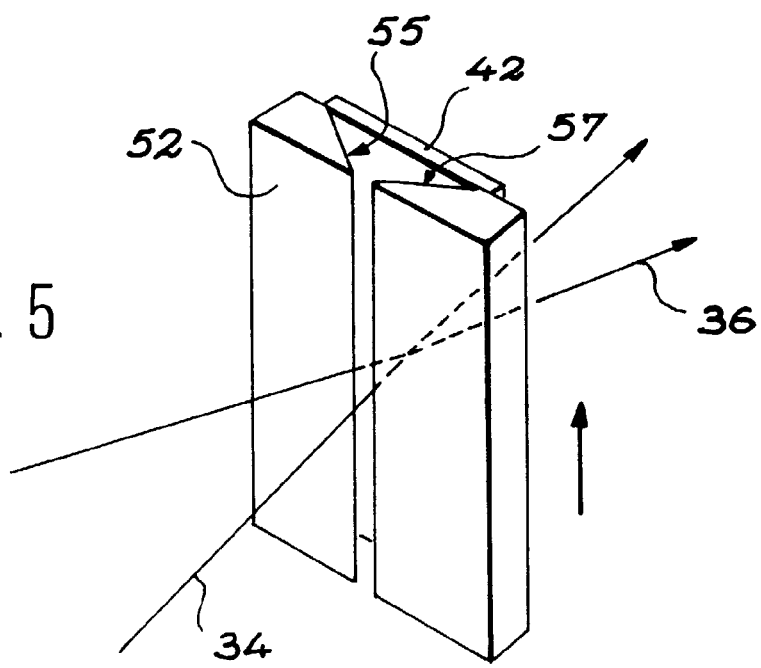

However, for a better absorption of the radiation(s) emitted by the front face of the target and a better re-emission of the latter towards the target, it is preferable that both walls delimiting the aperture run towards the target and away from one another as seen in FIG. 5 where both walls are referenced as 55 and 57.

Figure 6:
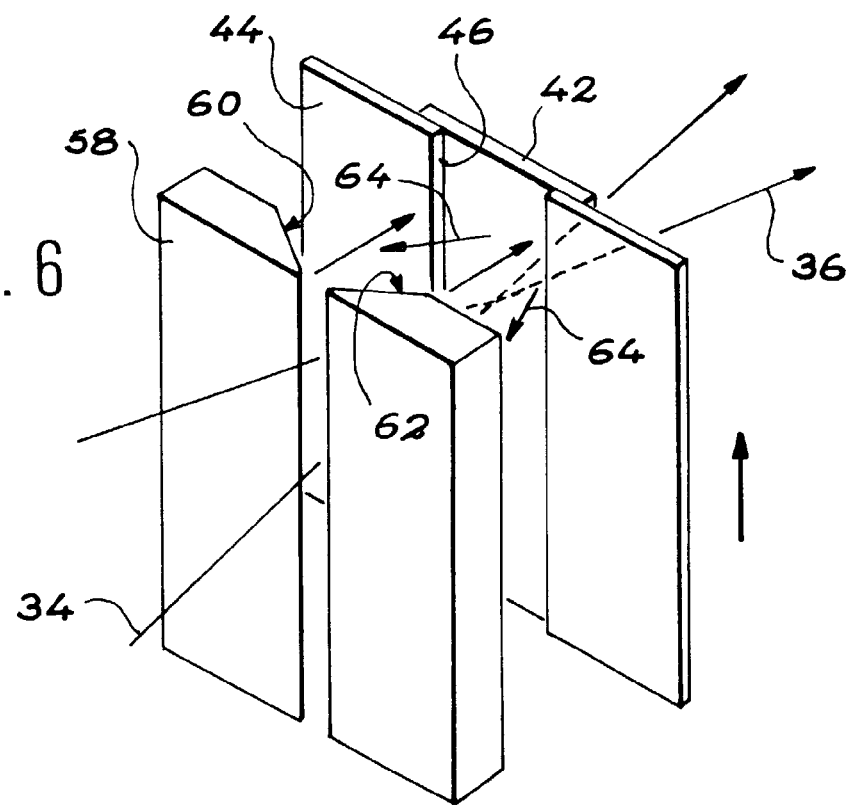
FIG. 6 is a perspective schematic and partial view of another EUV radiation source in accordance with the invention.

In another example schematically illustrated in FIG. 6, target 42 is fixed to a movable support 44 of the kind which was described in reference to FIG. 3. Moreover, in the example of FIG. 6, the EUV radiation source comprises a part 58 fixed with respect to the focussed laser beam 34 and positioned facing the front face of the target.

This part comprises an aperture letting the laser beam pass through, which is focussed on this front face of the target and the aperture with which this part is provided, flares out towards the target and thus comprises two walls 60 and 62 inclined with respect of this target, running towards the target and away from one another.

The radiation(s) 64 emitted by the front face of target 42 are then absorbed by these walls 60 and 62 and re-emitted in the direction of the front face of the target.

EUV radiation 36 emitted by the back face of the target is thus more intense.

Of course, an X ray source using X ray emission from the back face of a target formed by an aluminium sheet with a thickness of 7 µm and the front face of which is irradiated by a laser beam with a power density of $3 \times 10^3$ W/cm$^2$, is known from an article by H. Hirose et al., Prog. Crystal Growth and Charact., vol. 33, 1996, pp. 227–280.

However it should be noted that the method and the source, object of the present invention, use a target of low thickness, in the range from about 0.05 µm to about 5 µm, wherein this target is preferably made out of a material for which the atomic number Z is much greater than that of aluminum because Z is preferably greater or equal to 28 (and less or equal to 92).

It is specified that the preferred material for forming the target used in the present invention is tin for which Z is 50.

Moreover, in the invention, a target with a very thin thickness may be used, less or equal to 1 µm, formed on a plastic substrate (for example a $CH_2$ (polyethylene) substrate with a thickness of 1 µm), wherein the back face of this target (preferably in tin)—the face which emits the EUV radiation used—lies on the substrate. It is also possible to form on the front face of this target, a gold layer with a thickness less than 1000 Å (i.e. 100 nm).

Coming back to the aforementioned article, it should be noted that the aluminum target with a thickness of 7 µm cannot be considered for an emission by its back face when its front face irradiated by laser radiation with a maximum power density less than $3 \times 10^{13}$ W/cm$^2$, as mentioned in the article, and this, particularly in the field of microlithography, where the maximum power density considered above for example, is close to $10^{12}$ W/cm$^2$.

It should also be noted what follows:

When the laser interaction occurs on a material with a low atomic number Z, like aluminum (Z=13), the transfer of laser energy absorbed in the corona (on the side where the laser interacts: front face) to the cold and dense areas (i.e. to the back face) occurs by thermal electron conduction. Even if the target is relatively thick like the one provided in the aforementioned article, achieving anisotropic emission at the back face is not at all guaranteed.

On the other hand, in the case of high Z material, radiative conduction is what <<controls>> the conditioning of the inside and back of the target. Anisotropy which makes the present invention interesting, is directly linked to the outgoing of this radiative wave at the back face, thus to the selection of a thickness, for which an optimized value will be given in what follows.

On the other hand, the temperature and electron density characteristic profiles in the target irradiated by laser are very different according to whether the material has a low or high atomic number and also according to the target thickness used.

The optimal thickness $E_0$ for optimizing the conversion ratio X at the back face may be found by using an analytical model. $E_0$ is related to the atomic number Z of the target's material, to the atomic mass A of this material, to temperature T (°K) in this medium (itself related to the absorbed laser flux $\phi_a$ expressed in W/cm$^2$), to the laser's wavelength $\lambda$ ($\mu$m), to the pulse duration Dt (seconds) and to the mass density $\rho$(g/cm$^3$) by the following formula:

$$E_0(cm) = 26.22(A/Z)^{0.5} \times T^{0.5} \times D_t/\alpha$$

with $$\alpha = \rho \times \lambda^2 \times (1 + 0.946(A/Z)^{0.5})$$

Temperatures (°K) is proportional to $\phi_a^{2/3}$ and to $\lambda^{4/3}$.

For low available laser energy (less than 1 J), which is generally required within the scope of applying the invention to lithography, because a very high frequency (greater than 1 kHz) is required for producing sufficient statistics at the level of the photosensitive resin (thus ensuring that the insolation threshold is reached), and for a given emissive surface area (set by optimum coupling with the used optical system) (for example close to a diameter of 300 $\mu$m), the incident laser flux on the target is low. With a nanosecond rate, it does not exceed $10^{12}$ W/cm$^2$ at 1,06 $\mu$m. Furthermore, today, manufacturing lasers with these frequencies based on a 100 ps pulse train is practically inconceivable.

Under these conditions, the above model gives a value of 30 eV, as the medium temperature which may be attained if all the energy is absorbed.

Under these conditions, for aluminium, the optimal thickness which optimizes the conversion rate X at the back face is 0.15 $\mu$m, which is very far from the condition given in the aforementioned article. Furthermore, with a material such as aluminium, of low atomic number, the radiation emitted by the back face of the target does not a priori exhibit any angular feature: it is substantially isotropic; front face and back face may therefore be considered as equivalent.

In the case of gold, still under the same conditions, it is found to be less than 0.1 $\mu$m.

Referring back to the example given earlier of a tin target, formed on a $CH_2$ (polyethylene) substrate, the following specifications are given: polyethylene, which may be put on the back face of a thin sheet of tin, and gold which may be put on the front face of this sheet, both serve to limit the expansion of the emitter material formed by tin before it is heated by the radiative wave, so as to have the photons better <<penetrate>> the area of interest of the target. The polyethylene at the back face, which is slightly heated, is transparent to the radiation and also limits this expansion and consequently a little of the emission of matter remnants.

What is claimed is:

1. A method for obtaining extreme ultraviolet radiation, method according to which at least one solid target is used, said at least one solid target having first and second faces and being able to emit an extreme ultraviolet radiation by interaction with a laser beam, and the laser beam is focussed on the first face of the target, characterized in that the target contains a material which is able to emit the extreme ultraviolet radiation by interaction with the laser beam, and in that the thickness of the target is in a range from about 0.05 $\mu$m to about 5 $\mu$m, wherein the target is able to emit a portion of the extreme ultraviolet radiation from the second face of this target anisotropically, and in that this portion of extreme ultraviolet radiation is collected and transmitted for this portion to be used.

2. An extreme ultraviolet radiation source, comprising at least a solid target having first and second faces and being able to emit an extreme ultraviolet radiation by interaction with a laser beam focussed on the first face of the target, this source being characterized in that the target contains a material which is able to emit the extreme ultraviolet radiation by interaction with the laser beam, and in that the thickness of the target is in a range from about 0.05 $\mu$m to about 5 $\mu$m, wherein the target is able to anisotropically emit a portion of the extreme ultraviolet radiation from the second face of this target and wherein this portion of extreme ultraviolet radiation is collected and transmitted for this portion to be used.

3. A source according to claim 2, wherein the atomic number of the material contained in the target belongs to the set of atomic numbers from 28 to 92.

4. A source according to claim 2, comprising a plurality of targets which are integral with one another, wherein the source further comprises means for moving this plurality of targets so that these targets successively receive the laser beam.

5. A source according to claim 4, further comprising support means to which the targets are fixed and which are able to let the laser beam pass through toward these targets, wherein moving means are provided for moving these support means and thereby the targets.

6. A source according to claim 5, wherein the support means are able to absorb radiations emitted by the first face of each target which receives the laser beam and to re-emit these radiations towards this target.

7. A source according to claim 5, wherein the support means comprise an aperture facing each target, wherein this aperture is delimited by two walls substantially parallel to one another and perpendicular to this target.

8. A source according to claim 5, wherein the support means comprise an aperture facing each target, wherein this aperture is delimited by two walls which run towards the target and away from one another.

9. A source according to claim 2, further comprising fixed auxiliary means which are able to let the laser beam pass through toward the target, to absorb the radiations emitted by the first face of this target and to re-emit these radiations towards this target.

10. A lithography device comprising:
    a support of a sample to be insolated according to a determined pattern,
    an extreme ultraviolet radiation source, according to claim 2,
    a mask comprising the determined pattern in an enlarged form,
    optical means for collecting and transmitting, to the mask, the portion of extreme ultraviolet radiation from the second face of the target of the source, wherein the mask is thus able to provide an image of the pattern in an enlarged form, and
    optical means for reducing this image and for projecting the reduced image on the sample.

11. A device according to claim 10, wherein the sample comprises a semi-conductor substrate whereon is coated a photoresist layer which is to be insolated according to the determined pattern.

* * * * *

UNITED STATES PATENT AND TRADEMARK OFFICE
CERTIFICATE OF CORRECTION

PATENT NO. : 6,927,405 B1
DATED : August 9, 2005
INVENTOR(S) : Bonnet et al.

It is certified that error appears in the above-identified patent and that said Letters Patent is hereby corrected as shown below:

Column 8,
Line 30, delete "$3 \times 10^3$" and insert -- $3 \times 10^{13}$ --.

Signed and Sealed this

Twenty-eighth Day of February, 2006

JON W. DUDAS
*Director of the United States Patent and Trademark Office*